United States Patent [19]
Kakumu

[11] Patent Number: 5,466,958
[45] Date of Patent: Nov. 14, 1995

[54] MOS-TYPE SEMICONDUCTOR DEVICE HAVING ELECTRODE STRUCTURE CAPABLE OF COPING WITH SHORT-CHANNEL EFFECT AND MANUFACTURING METHOD THEREOF

[75] Inventor: Masakazu Kakumu, Kawasaki, Japan

[73] Assignee: Kabushiki Kaisha Toshiba, Kanagawa, Japan

[21] Appl. No.: 146,717

[22] Filed: Nov. 1, 1993

[30] Foreign Application Priority Data

Oct. 30, 1992 [JP] Japan ............................. 4-292774

[51] Int. Cl.⁶ .......................... H01L 29/10; H01L 29/78
[52] U.S. Cl. .................. 257/345; 257/344; 257/346; 257/408; 257/412; 257/900
[58] Field of Search ........................ 257/327, 344, 257/345, 346, 401, 408, 412, 900

[56] References Cited

FOREIGN PATENT DOCUMENTS

| | | | |
|---|---|---|---|
| 56-12773 | 2/1981 | Japan | 257/408 |
| 1-232765 | 9/1989 | Japan | 257/344 |
| 2-34936 | 2/1990 | Japan | 257/344 |

*Primary Examiner*—Ngân V. Ngô
*Attorney, Agent, or Firm*—Spensley Horn Jubas & Lubitz

[57] ABSTRACT

In a semiconductor device, an n⁺ polysilicon layer is formed on a substrate through a gateoxide layer. A p⁺ source or drain diffusion layer is formed on both sides of an impurity layer in the substrate. The silicon layer positions over an intermediate portion of a channel formation layer, and has an oxide layer on upper surface thereof. The silicon layers have their side portions a p⁺ type polysilicon layer to be a gate electrode together with the silicon layer. The gate electrode semiconductor layer is formed on the channel formation layer through the gate insulation layer in the manner that, in a portion contacting with the gate insulation layer, the nearer portions approaches to the impurity layers of the source and drain regions, the larger a work function increases.

3 Claims, 9 Drawing Sheets

THIRD STEP ST3

MOS-TYPE SEMICONDUCTOR DEVICE HAVING ELECTRODE STRUCTURE CAPABLE OF COPING WITH SHORT-CHANNEL EFFECT AND MANUFACTURING METHOD THEREOF

BACKGROUND OF THE INVENTION

The present invention relates to semiconductor devices and a manufacturing method thereof, and more particularly to metal oxide semiconductor (MOS) type devices having an electrode structure capable of coping with a short circuit effect and a manufacturing method thereof.

Figure 1:
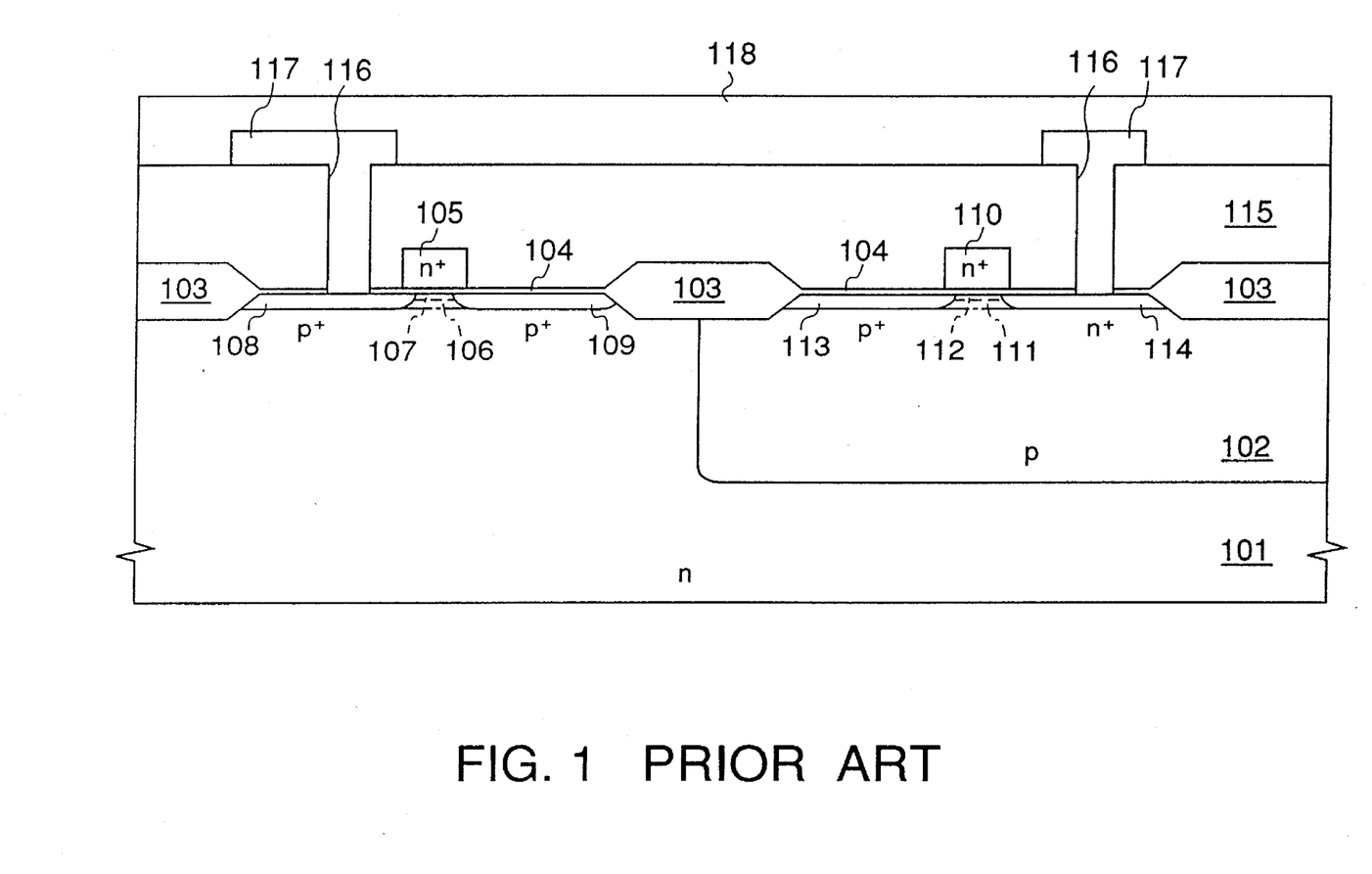
FIG. 1 is a sectional view of an element showing a constitution of the conventional CMOS inverter.

FIG. 1 shows a constitution of a conventional semiconductor device such as a complementary-MOS (CMOS) device, specifically as a CMOS inverter.

In FIG. 1, numeral 101 denotes an n-type silicon [Si (100)] substrate, and a p-type well 102 is formed in the substrate 101. An element dividing oxide layer 103 is formed upon the substrate 101 for forming on the substrate 101 and well 102 respective element regions for PMOS and NMOS and a dividing region for insulating between elements. A gate oxide layer 104 having a thickness of 100 angstrom is formed on the element regions.

A polysilicon layer having a thickness of 3000 angstrom to be a gate electrode is formed on the element region for PMOS via the gate oxide layer 104, which is made as an $n^+$-type by a diffusion of phosphorus (P). A first impurity layer 108 is formed in a region immediately under the polysilicon layer 105 in the substrate 101 to prevent a punch through, and a second impurity layer 107 is formed on the first impurity layer 106 at upper surface of the substrate 101 to adjust a threshold voltage value $V_{th}$. First and second impurity diffusion layers 108 and 109 to be a source or a drain of PMOS-FET (field effect transistor) are formed at both sides of the first and second impurity layers 106 and 107 by an ion implantation or a diffusion of phosphorus (P) or arsenic (As).

On the other hand, a polysilicon (policrystal silicon) layer 110 having a thickness of 3,000 angstrom to be a gate electrode is formed on the element region for NMOS via the gate oxide layer 104, which is also an $n^+$-type by a P-diffusion. A third impurity layer 111 is formed in a region immediately under the polysilicon layer 110 in the well 102 to prevent a punch through, and a fourth impurity layer 112 is formed on the third impurity layer 111 at upper surface of the well 102 to adjust a threshold voltage value $V_{th}$. Third and fourth impurity diffusion layer 113 and 114 to be a source or drain are formed at both sides of the third and fourth impurity layers 111 and 112 by an ion implantation or a diffusion of boron (B) or boron fluoride ($BF_2$).

A silicon oxide layer 115 for a layer insulation is formed upon an entire surface of the substrate 101 by a chemical vapor deposition (CVD), and contact holes 116 are formed by a photo-etching method in the manner that the holes 116 pass through the gate oxide layer 104 and the silicon oxide layer 115 respectively from the first and fourth impurity diffusion layer 108 and 114 which will be source regions of PMOS and nMOS to the upper surface of the oxide layer 115. In the holes 116, metal wiring portions 117 are formed of an alloy of aluminum (Al) and silicon (Si) by means of a spattering method and a patterning of a photo-etching method.

A passivation layer 118 is formed the entire surface of a wiring layer consisting of the oxide layer 115 and the wiring portions 117.

However, the conventional MOSFET is in a dilemma between an improvement of a reliability and an improvement of a device characteristic, namely, between a suppression of a short channel effect and an improvement of a current driving capability, and this problem is so serious especially about pMOSFET. Here, the short channel effect means that, in a short channel MOSFET, since a depletion layer extending into a gate contributes as a depletion layer on the side of a drain electrode, the depletion layer to be used as the gate electrode decreases, thereby reducing a threshold voltage. Accordingly, if a MOSFET has a short channel structure, the threshold voltage decreases because the threshold voltage sensitively depends upon a length of the gate.

With respect to a short-channel effect, there is a problem below. Because mass of boron (B) is smaller than that of phosphorus (P) or arsenic (As) as materials of the impurity diffusion layer of pMOS, boron (B) is inserted into deeper of the substrate at implanting an ion. Moreover, since a diffusion coefficient of boron (B) is larger than that of arsenic (As), it is difficult to shallowly form a $p^+$-junction used in pMOSFET, thereby resulting the problem that a depth of the junction causes a short channel effect to be in serious.

With respect to a mitigation of a short channel effect, a channel type may be changed into a surface channel type, or an LDD (a lightly doped drain source) structure. However, since both configurations make the device characteristic deteriorate, there are not the best countermeasure.

Figure 2:
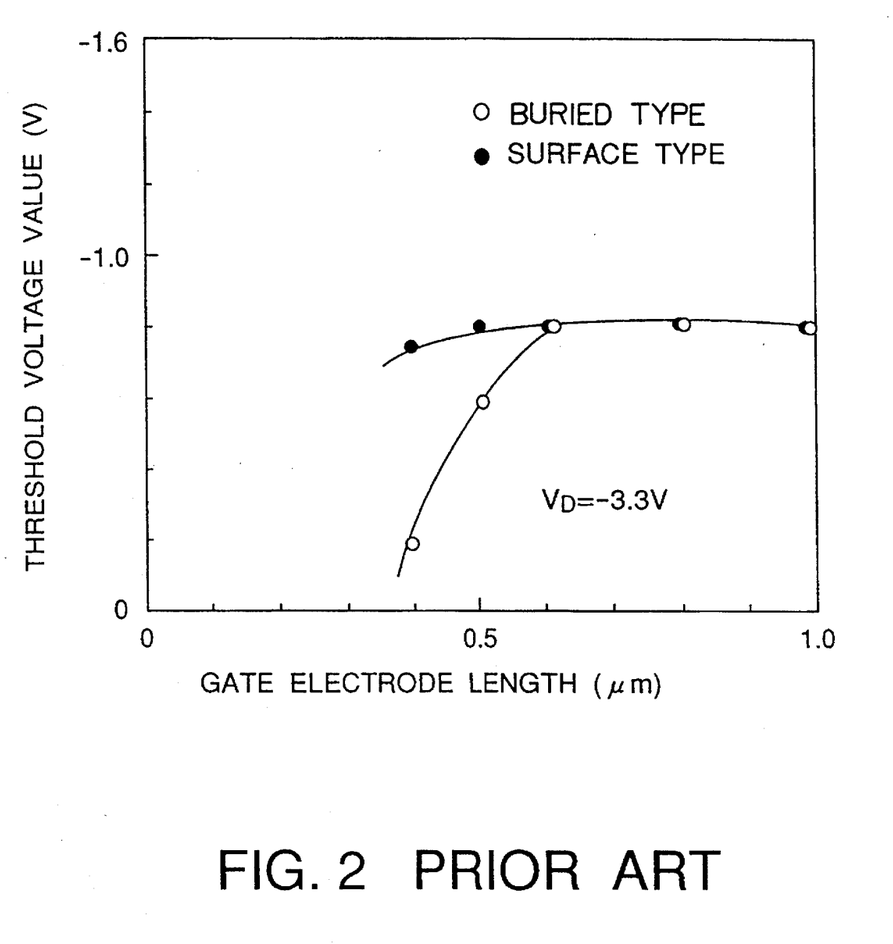
FIG. 2 is a graph showing a difference of a short channel effect according to a channel type between a surface type and a buried type.

Being described in more detail, when the gate electrode is formed of materials having a predetermined work function, it is possible to make a MOSFET having both of a surface channel type and a buried channel type. Namely, when the $n^+$-polysilicon is used as the gate electrode, the nMOSFET becomes a surface channel type and the pMOSFET becomes a buried channel type. In the buried channel type, a carrier is flowing in a portion which is different from the gate oxide layer and a boundary plane of the substrate with a short distance, thereby making the short channel effect be remarkable. Accordingly, a $p^+$-polysilicon is used as a pMOSFET to make it be a surface channel type, thereby mitigating a short channel effect. As being clarified from FIG. 2, the surface channel type has a threshold voltage larger than that of the buried channel type at the same length of the gate electrode. Accordingly, if the threshold voltage needs to be kept to a predetermined level, it is possible to make the gate electrode length of the surface channel type MOS shorter than that of the buried channel type MOS.

Figure 3:
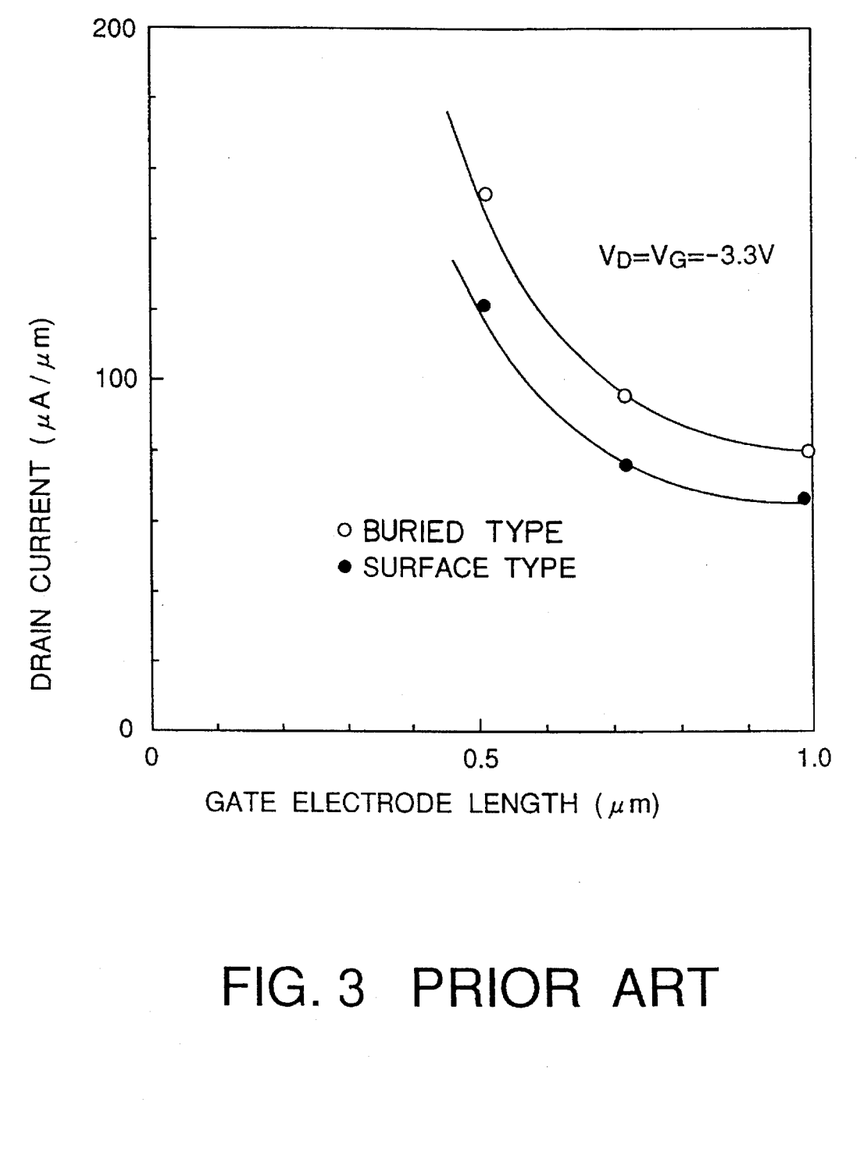
FIG. 3 is a graph showing a difference of a current driving capability according to a channel type between a surface type and a buried type.

However, in the surface channel type, since the carrier flows over the boundary surface of the MOS, resistive operation by the gate oxide layer interrupts flowing of the carrier, thereby reducing a current driving capability in comparison with the buried channel type, as shown in FIG. 3. As a result, even though the surface channel type has an effect in that the channel length can be shortened, the current driving capability of the surface channel type reduces. Accordingly, it is impossible to improve an operation speed.

Figure 4:
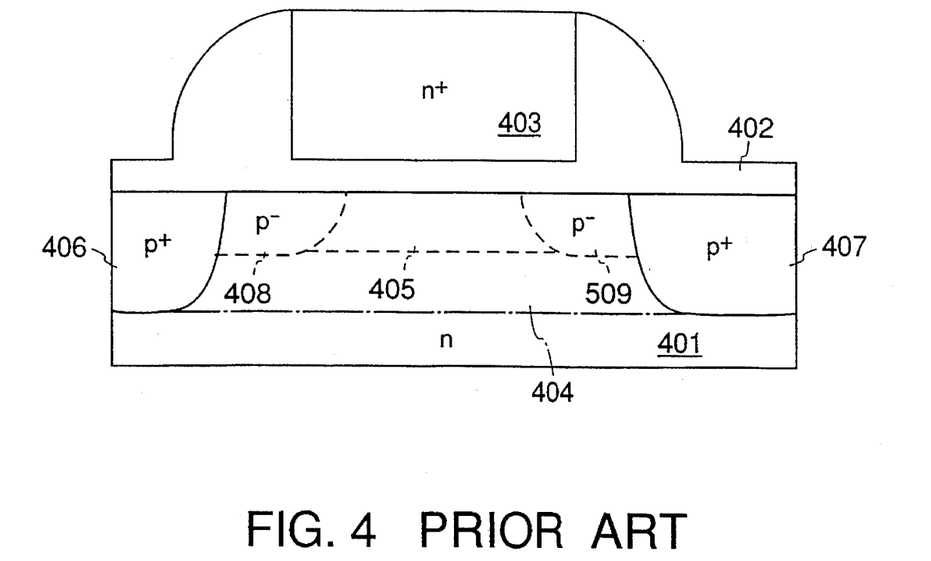
FIG. 4 is a sectional view of an element showing a main constitution of the conventional LDD pMOSFET.

On the other hand, the LDD structure as shown in FIG. 4 can reduce a short channel effect.

In FIG. 4, the LDD MOS comprises a substrate 401, a gate oxide layer 402, an $n^+$-polysilicon layer 403 to be the gate electrode, a first impurity layer 404 for preventing a punch through, a second impurity layer 405 for adjusting a threshold voltage $V_{th}$, a first $p^+$ impurity diffusion layer 406 which will be a source region, and a second $p^+$ impurity diffusion layer 407 which will be a drain region. In the LDD structure, the difference opposing to the constitution shown in FIG. 1 resides in that there are provided a third and fourth impurity regions 408 and 409 at every inner sides of the first and second impurity regions 408 and 407 and having a low concentration of 1E18 to 1E19 (in this example, $p^-$-type).

Since the LDD structure can form a shallow junction by the $p^-$-type impurity diffusion layers 408 and 409, it is possible to suppress a short channel effect.

However, since the low concentration layers such as the impurity diffusion layer 408 and 409 have the large resistance, the current driving capability is reduced, thereby resulting a formation of a MOS which is not adaptive to high-speed operation.

Even though there has been described the problems of the conventional MOSFET mainly with respect to a pMOS, an nMOS is also in a dilemma between an improvement of a current driving capability and a reduction of a short channel effect in surface and buried channel types and an LDD structure.

As described above, the conventional MOSFET is in dilemma between a suppression of a short channel effect and an improvement of a current driving capability.

SUMMARY OF THE INVENTION

In view of the above-mentioned condition, an object of the present invention is to provide MOS devices having an electrode structure capable of coping with a short channel effect and a manufacturing method thereof, without sacrifices of a current driving capability.

More specifically, an object of the present invention is to provide a semiconductor device capable of realizing a MOSFET structure adopting a buried channel type and suppressing a short channel effect.

In order to achieve the above-objects, a MOS device according to the present invention comprises a semiconductor substrate having a first conductive type, an element dividing insulation layer which is formed in the manner of dividing the substrate into element regions and insulation regions between the element regions, a gate insulation layer formed on the element regions, a source region impurity diffusion layer formed on one side of a channel formation layer in the element regions and having a second conductive type, a drain region impurity diffusion layer formed on the other side of the channel formation layer in the element region and having the second conductive type, and a gate electrode semiconductor layer formed on the channel formation layer through the gate insulation layer in the manner that, in a portion contacting with the gate insulation layer, the nearer portions approaches to the impurity layers of the source and drain regions, the larger a work function increases.

In a desired embodiment, a gate electrode semiconductor layer is formed in the manner that the maximum value of the work function increases on or more 0.5 eV (electron volts) than the minimum value in a portion contacting with the gate insulation layer.

Such the embodiment can be realized by an $n^+$-polysilicon layer which is formed on an intermediate region of the channel formation layer, and a $p^+$-polysilicon layer which is formed as a side wall of the $n^+$-polysilicon layer.

The semiconductor device according to the present invention is made by the following method. The manufacturing method comprises a step of forming an element dividing insulation layer in the manner of dividing the substrate into element regions and insulation regions between the element regions, a step of forming a gate insulation layer on the element regions, a step of forming a first semiconductor layer on a channel formation layer through the gate insulation layer, a step of patterning the first semiconductor layer as a gate electrode, and a step of forming a second semiconductor layer on both side walls of the first semiconductor layer and having a work function larger than that of the first semiconductor layer.

According to the present invention, since the semiconductor layer forming the gate electrode is formed in the manner that the work function of the portion contacting with the gate insulation layer becomes larger and larger with approaching to the impurity diffusion layer of the source region and drain region, a voltage which is supplied to the channel formation layer from a portion having correlatively high work function in the semiconductor layer, is usually lower than a voltage which is supplied from a portion having correlatively low work function. Since the formation of the channel in the intermediate portion of the channel formation layer is performed by the gate electrode portion having correlatively low work function and since the formation of channel of edge portion adjacent to each regions of the source and drain is performed the gate electrode portion having correlatively high work function, much carrier are usually excited in the edge portion of the channel formation layer in comparison with the intermediate channel portion, thereby obtaining a junction which is shallowly and effectively formed in edges of the source and drain which have a resistance lower than the channel intermediate portion. Accordingly, the semiconductor devices are comprised of the channel intermediate portion having a high current driving capability, the channel edge portion capable of overcoming a short channel effect, and the surface type channel having a high current driving capability with low resistance, thereby obtaining a MOSFET having an effective structure for overcoming a short channel effect, especially a pMOSFET.

DETAILED DESCRIPTION OF THE PREFERRED EMBODIMENTS

There will be described in detail semiconductor devices according to preferred embodiments of the present invention in reference with the attached drawings.

Figure 5:
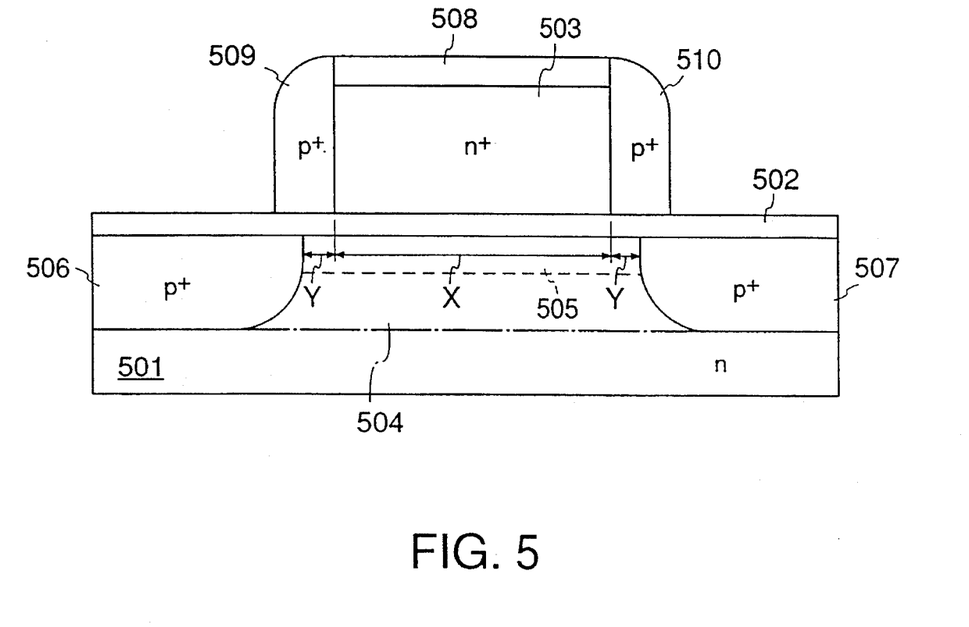
FIG. 5 is a sectional view of an element showing of a main constitution of a pMOSFET device according to a first embodiment of the present invention.

FIG. 5 shows a main constitution of a pMOSFET as a semiconductor device according to a first embodiment of the present invention.

In FIG. 5, numeral 501 denotes a silicon [Si (100)] substrate having an n conductivity type and a comparative resistance of 1–2 $\Omega$.cm (ohm centimeters), a gate oxide layer 502 is formed on the substrate 501, and a polysilicon layer 503 is formed on the gate oxide layer 502, which constitutes a portion of a gate electrode and is an $n^+$ type to which phosphorus is added by a high concentration.

A first impurity addition layer 504 for preventing a punch through, is formed in a region near a surface immediately under the polysilicon layer 503 in the substrate by means of an implantation of an ion of low-concentration phosphorus. A second impurity addition layer 505 for adjusting a threshold voltage $V_{th}$, is formed between the first impurity addition layer 504 and a surface of the substrate 501 by means of an ion implantation by a phosphorus concentration higher than that of the first impurity addition layer 504 in a few degree.

A first $p^+$ impurity diffusion layer 506 to be a source is formed on one side of the impurity addition layers 504 and 505 in the substrate 501 by means of an ion implantation and diffusion of boron, and a second $p^+$ impurity diffusion layer 507 is formed on the other side of the impurity addition layers 504 and 505 to be a drain.

The gate polysilicon layer 503 is positioned to an intermediate portion of a channel formation layer in the substrate 501, and a CVD oxide layer 508 is covered over the polysilicon layer 503 to have a thickness of 1,000 angstrom. Polysilicon layers 509 and 510 to be side walls are formed on a side of a two-strata layer of the polysilicon and the oxide layer 508, which constitutes the gate electrode together with the polysilicon layer 503 and in which high concentration boron is implanted and diffused to form a $p^+$ type, thereby resulting a work function 1.1 eV higher than that of the polysilicon layer 503. The polysilicon layers 509 and 510 are respectively arranged in the manner of that the layer 509 positions on an edge of the impurity diffusion layer 506 and the impurity addition layers 504 and 505, and the layer 510 positions on an edge of the impurity diffusion layer 507 and the impurity addition layers 504 and 505.

In the above-mentioned constitution, since the work function of the polysilicon layers 509 and 510 is 1.1 eV higher than that of the polysilicon layer 503, a voltage supplied to a lower region of the polysilicon layers 509 and 510 (an area shown by symbol Y in FIG. 5) is usually 1.1 V lower than a voltage supplied to a lower region of the polysilicon layer 503 (an area shown by symbol X in FIG. 5). Since a channel formation in an intermediate portion of a channel formation layer is performed by the polysilicon layer 503 which positions over the intermediate portion of the channel formation layer and since the polysilicon layers 509 and 510 positions on every edges of respective channel region and controls a channel formation, the edge portions of the channel formation layer usually excites much carrier more than that of the intermediate portion. Accordingly, the semiconductor devices are comprised of the channel intermediate portion having a high current driving capability, the channel edge portion capable of overcoming a short channel effect, and the surface type channel having a high current driving capability with low resistance, thereby obtaining a MOSFET having an effective structure for overcoming a short channel effect, especially a pMOSFET.

Figure 6:
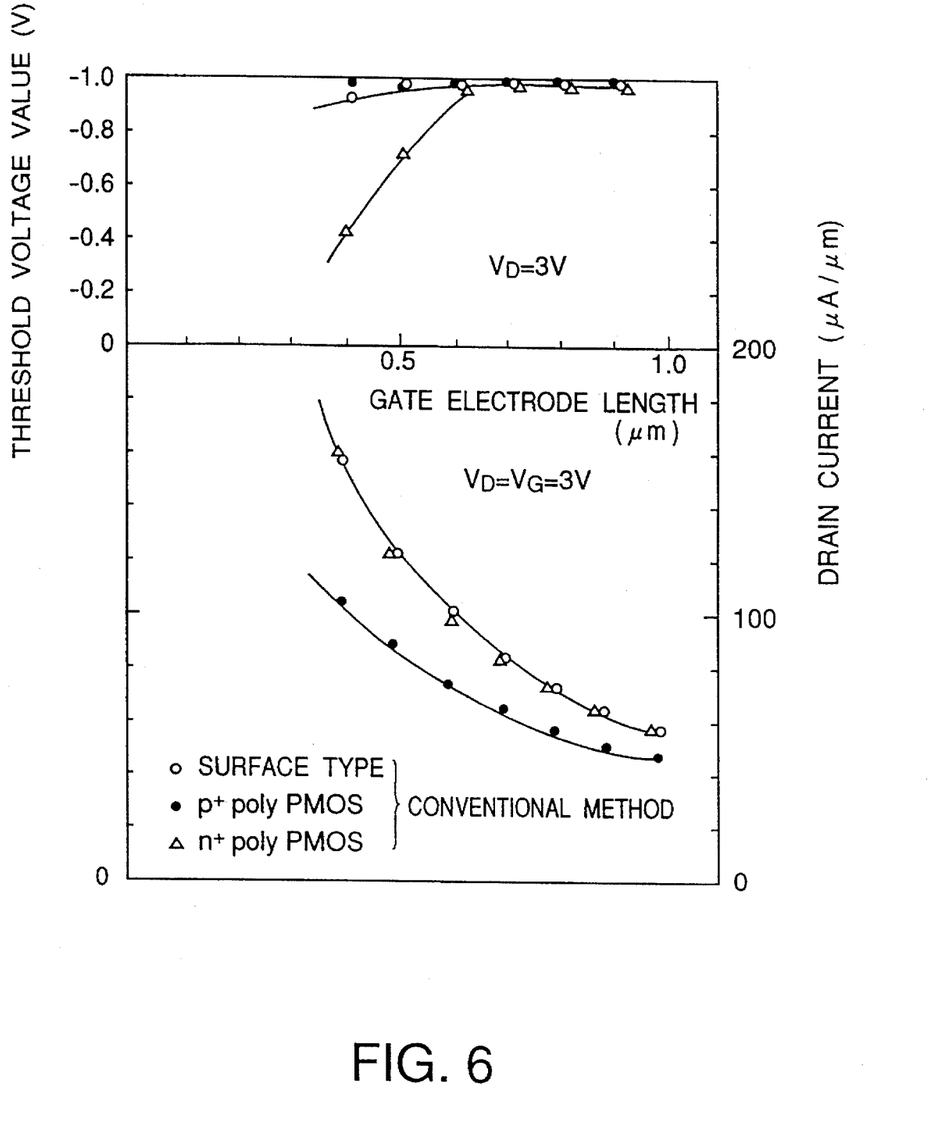
FIG. 6 is a graph showing a measuring result of a short channel effect and a current driving capability with respect to pMOSFET shown in FIG. 5.

FIG. 6 shows a result of measuring a short channel effect and a current driving capability by applying the first embodiment to a pMOSFET.

As being clarified from FIG. 6, the present invention can realize a short channel effect similar to the conventional surface channel type and a current driving capability similar to the conventional buried channel type. Particularly, it is possible to recognize a 60% improvement of the current driving capability by a channel having a length of 0.4 $\mu$m. Even though there is not shown in any figure, when we manufacture side walls of a MOSFET by using materials of 0.5 eV different from the $n^+$ polysilicon, there is an improvement of 10% in the current driving capability. Even though there is few errors in processes, a 10% improvement results few effect. Accordingly, in order to be sure an effect of the present invention, it is necessary to make the difference between work functions between the polysilicon layer 503 and the layers 509 and 510 be on or more than 0.5 eV.

Figure 7:
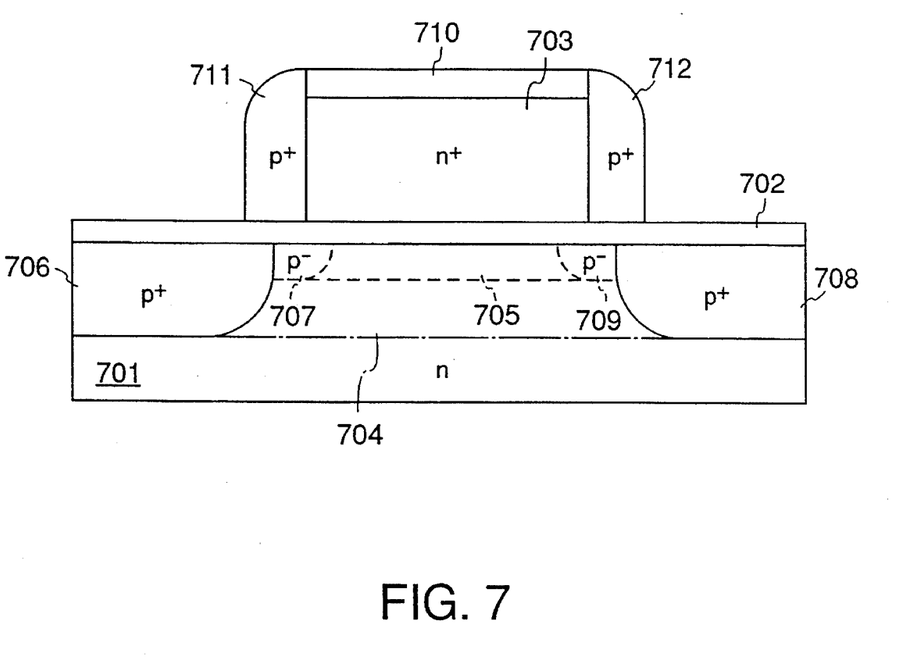
FIG. 7 is a sectional view of an element showing of a main constitution of an LDD pMOSFET device according to a first embodiment of the present invention.

FIG. 7 shows a semiconductor device according to a second embodiment of the present invention, namely, a main constitution of pMOSFET having an LDD structure.

In FIG. 7, numeral 701 denotes a silicon. [Si (100)] substrate having an n conductivity type and a comparative resistance of 1–2 $\Omega$.cm (ohm centimeters), a gate oxide layer 702 is formed on the substrate 701, and a polysilicon layer 703 is formed on the gate oxide layer 702, which constitutes a portion of a gate electrode and is an $n^+$ type to which phosphorus is added by a high concentration.

A first impurity addition layer 704 for preventing a punch through, is formed in a region near a surface immediately under the polysilicon layer 703 in the substrate 701 by means of an implantation of an ion of low-concentration phosphorus (P). A second impurity addition layer 705 for adjusting a threshold voltage $V_{th}$, is formed between the first impurity addition layer 704 and a surface of the substrate 701 by means of an ion implantation by a phosphorus (P) concentration higher than that of the first impurity addition layer 704 in a few degree.

A first $p^+$ impurity diffusion layer 708 to be a source is formed on one side of the impurity addition layers 704 and 705 in the substrate 701 by means of an ion implantation and diffusion of boron (B), and a first $p^-$ impurity diffusion layer 707 to be a source region together with the layer 708 is formed between the impurity addition layer 705 and the $p^+$ type impurity diffusion layer 708 by means of an ion implantation and diffusion of boron (B). A second $p^+$ impurity diffusion layer 708 to be a drain is formed on the other side of the impurity addition layers 704 and 705 by means of an ion implantation and diffusion of boron (B), and a second $p^-$ impurity diffusion layer 707 to be a drain region together with the layer 708 is formed between the impurity addition layer 705 and the $p^+$ type impurity diffusion layer 708 by means of an ion implantation and diffusion of boron (B).

The gate polysilicon layer 703 is positioned to an intermediate portion of a channel formation layer in the substrate 701, and a CVD oxide layer 710 is covered over the polysilicon layer 703 to have a thickness of 1,000 angstrom. Polysilicon layers 711 and 712 to be side walls are formed on a side of a two-strata layer of the polysilicon and the oxide layer 710, which constitutes the gate electrode together with the polysilicon layer 703 and in which high concentration boron is implanted and diffused to form a $p^+$ type, thereby resulting a work function 1.1 eV higher than that of the polysilicon layer 703. The polysilicon layers 711 and 712 are respectively arranged in the manner of that the layer 711 positions on an edge of the impurity diffusion layer 706 and 707, and the layer 712 positions on an edge of the impurity diffusion layer 708 and 709.

By the above-mentioned constitution, it is possible to obtain an effect similar to that of the first embodiment shown in FIG. 5. Namely, since the work function of the polysilicon layers 711 and 712 is 1.1 eV higher than that of the polysilicon layer 703, a voltage supplied to a lower region of the polysilicon layers 711 and 712 is usually 1.1 V lower than a voltage supplied to a lower region of the polysilicon layer 703. Since a channel formation in an intermediate portion of a channel formation layer is performed by the polysilicon layer 703 which positions over the intermediate portion of the channel formation layer and since the polysilicon layers 711 and 712 positions on every edges of respective channel region and controls a channel formation, the edge portions of the channel formation layer usually excites much carrier more than that of the intermediate portion. Accordingly, the semiconductor devices are comprised of the channel intermediate portion having a high current driving capability, the channel edge portion capable of overcoming a short channel effect, and the surface type channel having a high current driving capability with low resistance, thereby obtaining a MOSFET having an effective structure for overcoming a short channel effect, especially a pMOSFET.

Figure 8:
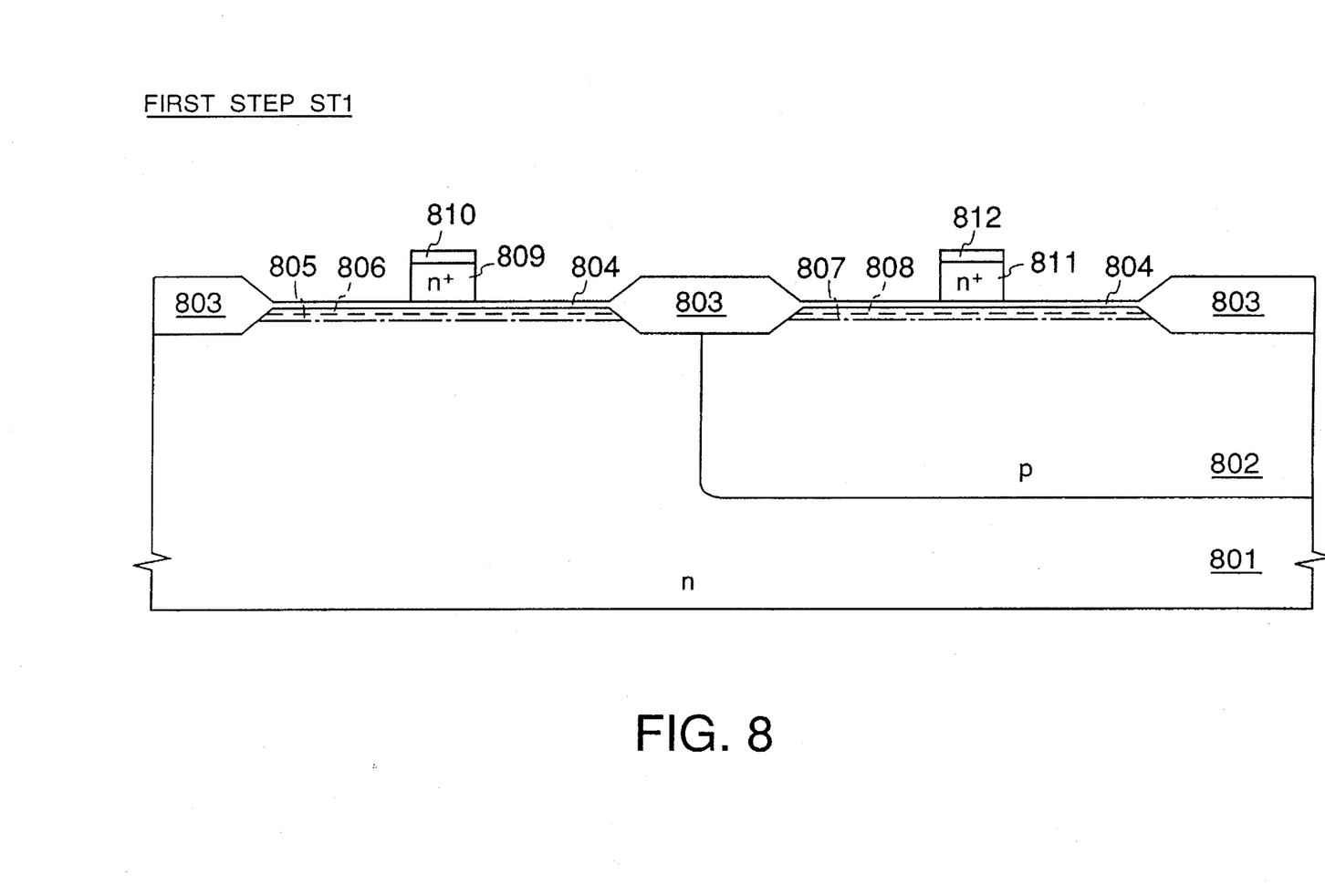
FIG. 8 is a sectional view of an element for explaining formation from a p-well to a polysilicon layer to be a first semiconductor layer in a manufacturing method thereof when a pMOS shown in FIG. 5 is applied to a CMOS inverter.
Figure 9:
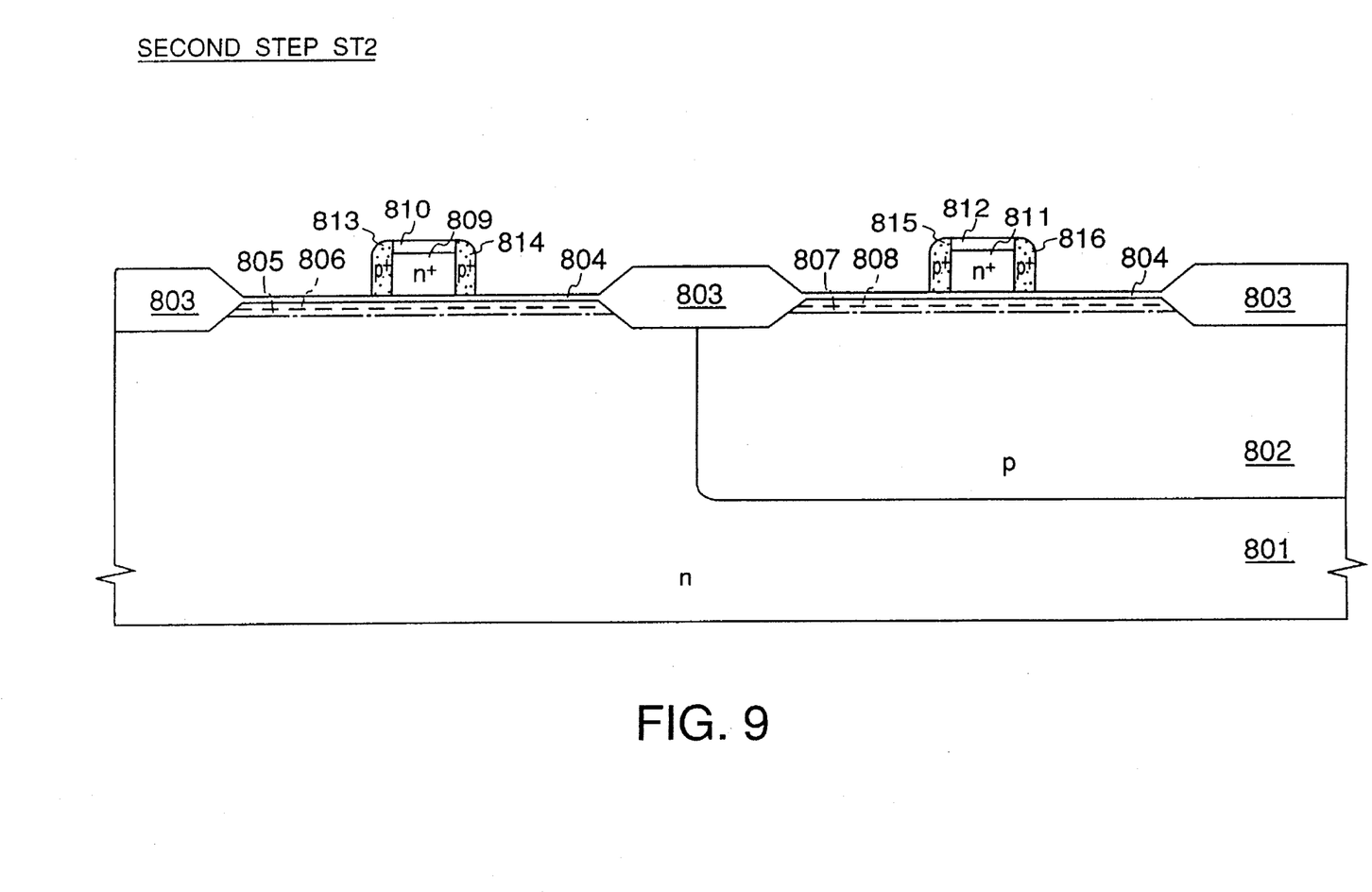
FIG. 9 is a sectional view of an element for explaining a step of forming a side wall to be a second semiconductor layer, succeeding the step shown in FIG. 8.
Figure 10:
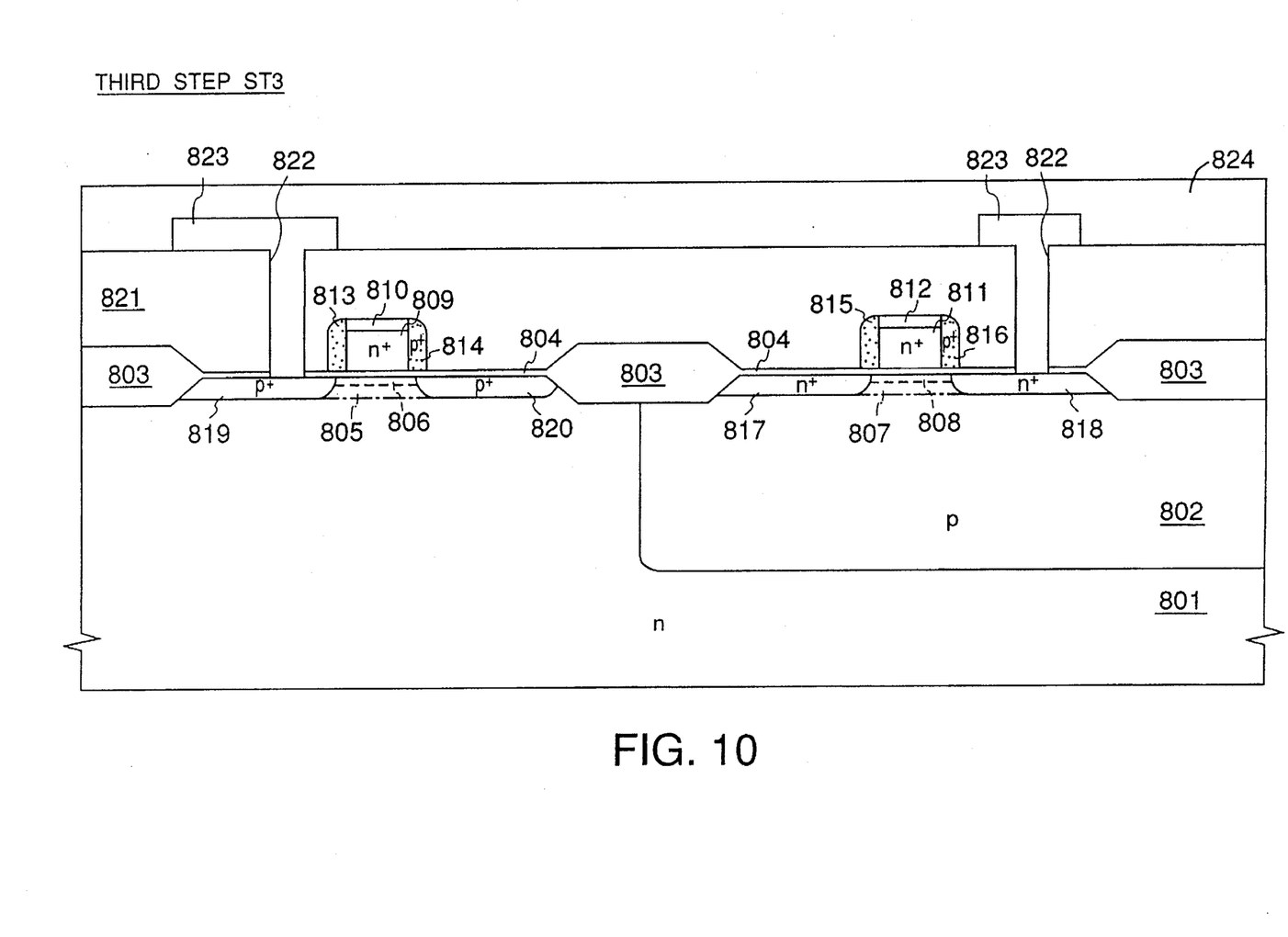
FIG. 10 is a sectional view of an element for explaining the steps of formation from source and drain regions to a passivation layer, succeeding the step shown in FIG. 9.

FIGS. 8–10 show a manufacturing process in the case where the constitution shown in FIG. 5 is applied to a CMOS inverter.

At first, as shown in FIG. 8, in a silicon (Si) substrate 801 having a crystal direction (100) of an n type and a-comparative resistance 1–2 $\Omega$.cm, a p type well 802 is formed with a depth of about 3 μm. After this, an oxide layer 803 is formed by a heat oxidation and selective oxidation so as to form an element region and an insulation division region. Then, a gate oxide layer 804 is formed on the element region with a depth of 100 angstrom.

Then, an ion of boron (B) is implanted into a region under the gate oxide layer 804 with masking over the well 802 by 100 keV of energy and 4E12 of dose amount so as to form an impurity addition layer 805 for preventing from a punch through. Next, an ion of boron (B) is implanted into the same region by 25 keV of energy and 5E12 of dose amount so as to form an impurity addition layer 806 for adjusting a threshold voltage.

Next, an ion of phosphorus (P) is implanted into a region without the well 802 with masking by 220 keV of energy and 3E12 of dose amount so as to form an impurity addition layer 807 for preventing from punching through. Next, an ion of phosphorus (P) is implanted into a shallow portion of the same region by 20 keV of energy and 3E12 of dose amount so as to form an impurity layer 808 for adjusting a threshold voltage.

Next, phosphorus (P) is diffused over entire surface after depositing 3,000 angstrom of polysilicon on the surface so as to form the polysilicon layer to be an $n^+$ type. Furthermore, an oxide layer with a thickness of 1,000 angstrom is deposited on the polysilicon layer by a chemical vapor deposition (CVD). Then, two-strata layer of the polysilicon layer and the oxide layer is treated by patterning by means of a lithographic technique and etching so as to form a gate electrode including a polysilicon layer 809 and an oxide layer 810 and a gate electrode including a polysilicon 811 and an oxide layer 812 (step ST1).

Next, a $p^+$ polysilicon is deposited over the entire surface with a thickness of 1,000 angstrom to form a polysilicon layer which will be treated by a reaction ion etching (RIE). As shown in FIG. 9, side walls 813 and 814 are formed in the two-strata layer including the polysilicon layer 809 and the oxide layer 810, and at the same, side walls 815 and 816 are formed in the two-strata layer including the polysilicon layer 811 and the oxide layer 812 (step ST2).

After that, as shown in FIG. 10, an ion of arsenic (As) or phosphorus (P) is implanted into both sides of the gate electrode in the well 802 so as to form $n^+$ impurity diffusion layers 817 and 818 to be source and drain regions of the nMOSFET. Then, an ion of boron (B) or boron fluoride ($BF_2$) is implanted into both side of the gate electrode in the substrate 801 so as to form $p^+$ type impurity diffusion layers 817 and 818 to be source and drain regions of the pMOS.

Next, an oxide layer is deposited over the entire surface by a chemical vapor deposition (CVD) to form a layer-dividing oxide layer 821 is formed for dividing the element layer and the wiring layer. After that, a contact hole 822 is formed by a photographic etching method, and a wiring portion 823 is formed by a photographic etching method after sputtering aluminum-silicon (Al—Si) by a sputtering method. At last, a passivation layer 824 is formed, there completing a wiring step (step ST3).

According to the above-mentioned steps, it is possible to obtain a CMOSFET having two kinds of work functions of the gate electrode which contacts at least a MOS boundary surface of a MOSFET, and the CMOS which can change carrier densities exciting in the contact region between the source and drain and in the channel intermediate region.

Even though there has been described the method of generating a $p^+$ type polysilicon at the side walls of the $n^+$ type polysilicon of the pMOSFET in the first embodiment, it is possible to obtain the same effect as above by the following method. Namely, an $n^+$ type polysilicon gate electrode is formed by the ordinary method, after that, side walls of a $p^+$ type polysilicon are formed by an ion implantation and diffusion method.

Furthermore, since the $p^+$ type polysilicon side walls are formed on the side of an nMOSFET in the constitution shown in FIGS. 8–10, such the case has an effect for improving a reliability by mitigating an electric field near the drain because the drain current flows in the silicon layer.

Even though there have been described cases using polysilicon in the above embodiment of the present invention, when silicide or metal may be used in the place of $p^+$ polysilicon, it is possible to obtain the same effect described above.

What is claimed is:

1. A semiconductor device comprising:
   a substrate formed of semiconductor having a first conductive type;
   an element dividing insulation layer that divides the substrate into element regions and insulation regions between the element regions;

a gate insulation layer formed on the element regions;

a channel formation layer disposed within an element region between the substrate and the gate insulation layer;

a source electrode formed on one side of the channel formation layer and having a high concentration of impurities of a second conductivity type;

a drain electrode formed on an other side of the channel formation layer and having a high concentration of impurities of the second conductivity type;

said channel formation layer comprising a first impurity addition layer for preventing punch through positioned between the substrate and the gate insulation layer, said channel formation layer further comprising a second impurity addition layer positioned between the first impurity addition layer and the gate insulation layer, wherein the second impurity addition layer comprises a central portion for regulating a threshold voltage and being supplied a voltage in excess of the threshold value and edge portions which are supplied a voltage of a second predetermined value less than the threshold value; and a gate electrode formed on the gate insulation layer and including a first polysilicon layer having a high concentration of impurities of the first conductivity type and positioned at a portion corresponding to the center portion of the second impurity addition layer and an oxide layer stacked on the first polysilicon layer, the gate electrode further including second polysilicon layers having a high concentration of impurities of the second conductivity type and positioned along either side of the first polysilicon layer and the oxide layer, wherein the second polysilicon layers are positioned over portions of the source and drain electrodes and over the edge portions of the second impurity addition layer.

2. The semiconductor device according to claim 1, wherein said gate electrode layer is formed in the manner that the maximum value of the work function increases on or more 0.5 eV (electron volts) than the minimum value in a portion contacting with the gate insulation layer.

3. The semiconductor device according to claim 1, wherein said gate electrode layer comprises an $n^+$-polysilicon layer which is formed on an intermediate region of the channel formation layer, and a $p^+$-polysilicon layer which is formed as a side wall of the $n^+$-polysilicon layer.

* * * * *